(12) United States Patent
Mikuni (10) Patent No.: US 6,228,690 B1
(45) Date of Patent: May 8, 2001

(54) METHOD OF MANUFACTURING FUSE ELEMENT USED IN MEMORY DEVICE AND FUSE ELEMENT

(75) Inventor: Yasunori Mikuni, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/382,514

(22) Filed: Aug. 25, 1999

(30) Foreign Application Priority Data

Aug. 27, 1998 (JP) ................................................ 10-241418

(51) Int. Cl.$^7$ .................................................. H01L 21/82
(52) U.S. Cl. .......................................... 438/132; 438/601
(58) Field of Search .................................... 438/132, 281, 438/467, 601; 148/55; 257/529

(56) References Cited

U.S. PATENT DOCUMENTS

| | | | |
|---|---|---|---|
| 5,652,459 | * 7/1997 | Chen ..................................... | 257/529 |
| 5,965,927 | * 10/1999 | Lee et al. .............................. | 257/529 |
| 6,100,116 | * 8/2000 | Lee et al. .............................. | 438/128 |
| 6,107,178 | * 8/2000 | Becker et al. ........................ | 438/601 |

FOREIGN PATENT DOCUMENTS 5-235170  9/1993  (JP) .

* cited by examiner

Primary Examiner—Charles Bowers
Assistant Examiner—William M. Brewster
(74) Attorney, Agent, or Firm—Hayes, Soloway, Hennessey, Grossman & Hage (57) ABSTRACT

A method of manufacturing a fuse element used in a semiconductor memory device by which P/W repair rate can be improved, and a fuse element produced by such method. The method comprises: forming a first interlayer insulating film including BPSG so as to cover the fuse line and planarizing the top surface; forming a polysilicon film on the first interlayer insulating film; forming a second interlayer insulating film including BPSG on the polysilicon film and planarizing the top surface; partially etching the second interlayer insulating film and an upper region of the polysilicon film to form a first opening portion above the fuse line; forming a wiring layer on inner walls of the first opening portion and on the second interlayer insulating film; partially etching the wiring layer and the polysilicon film at the bottom portion of the first opening portion to form a second opening portion above the fuse line and to expose the first interlayer insulating film; forming an insulating film on at least inner walls of the first second opening portions; and partially etching the insulating film at the bottom portion of the second opening portion and an upper region of the first interlayer insulating film to form a third opening portion above the fuse line.

11 Claims, 4 Drawing Sheets

PRIOR ART

METHOD OF MANUFACTURING FUSE ELEMENT USED IN MEMORY DEVICE AND FUSE ELEMENT

FIELD OF THE INVENTION

The present invention relates generally to a method of manufacturing a fuse element which is used in a memory device and which is provided along with a memory cell array of a memory device, and to a fuse element produced by such method. More particularly, the present invention relates to a method of manufacturing such fuse element, by which it is possible to realize a fuse element which is appropriately and reliably trimmed to replace defective memory cells with normal cells and by which P/W repair rate can be improved.

BACKGROUND OF THE INVENTION

In a semiconductor memory device, such as a dynamic random access memory (DRAM) device, fuse elements are provided along with each memory cell array. Sometimes a fuse line of each fuse element also constitutes a bit line. In a products test of a semiconductor memory device, when malfunction of a memory cell is detected in a memory cell array, the fuse line of the fuse element relating to the memory cell having malfunction is melted down using a laser beam. Thereby, it becomes possible to replace the memory cell having malfunction with another normal memory cell, and a memory device which included the memory cell having malfunction can be repaired into a memory device having complete function.

Here, in a products test of a semiconductor memory device, when bit lines including defective memory cells are replaced with other bit lines having normal cells by melting down fuse elements using laser beams, a ratio of the number of addresses normally repaired to the number of addresses including defective memory cells is called as a P/W rate. Of course, the P/W rate should be as higher as possible.

Figure 5:
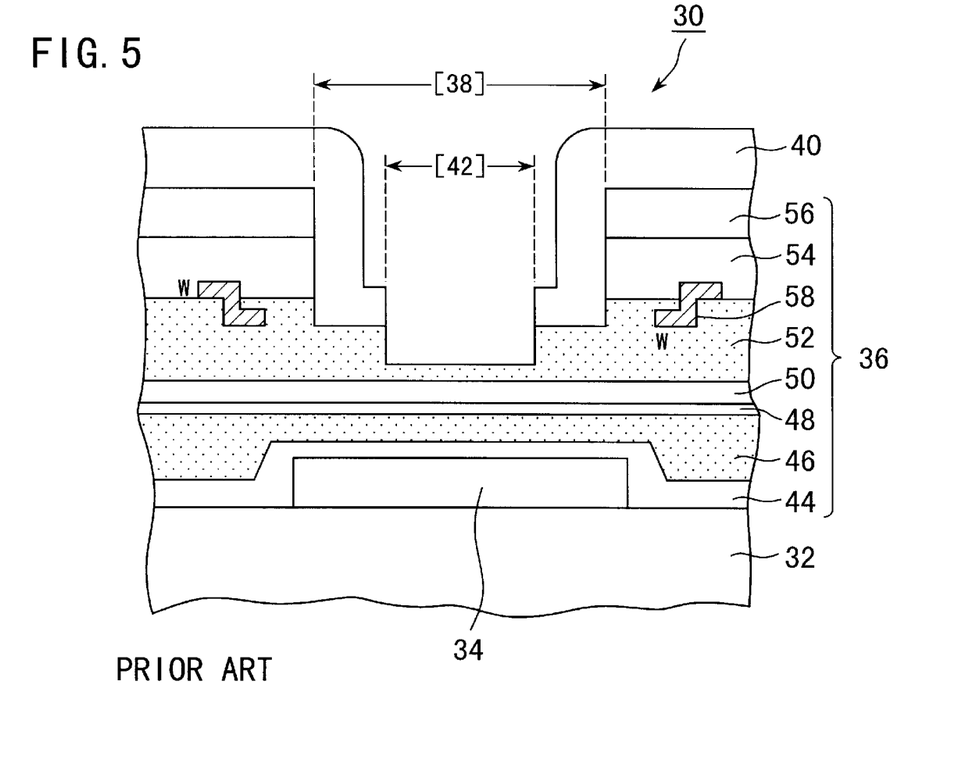
FIG. 5 is a partial cross sectional view showing a structure of a conventional fuse element used in a memory device.

With respect to FIG. 5, an explanation will be made on a structure of a fuse element used in a conventional memory device. FIG. 5 is a cross sectional view showing a structure of a fuse element used in a conventional memory device.

As shown in FIG. 5, a fuse element 30 comprises a fuse line portion 34 formed on a grounding layer 32. On the fuse line portion 34, a laminated structure 36 is formed. The fuse element 30 also comprises a first opening portion 38 which is formed by partially etching and opening the laminated structure 36 on the fuse line portion 34. The fuse element 30 further comprises a cover layer 40 which coats the surface portion of the fuse element 30 including inner walls of the opening portion 38. Also, a second opening portion 42 is formed by etching and opening the cover layer 40 at the bottom portion of the first opening portion 38 and a portion of the laminated structure 36. It should be noted that the fuse element is elongated in the direction perpendicular to the sheet of the drawing.

The laminated structure 36 is formed by sequentially forming a first SiO2 film or layer 44, a first BPSG (Boron-doped Phosphor-Silicate Glass) film or layer 46, a second SiO2 film or layer 48, a third SiO2 film or layer 50, a second BPSG film or layer 52, a fourth SiO2 film or layer 54, and a fifth SiO2 film or layer 56, on the fuse line portion 34.

The first opening portion 38 is formed by penetrating through the fifth SiO2 layer 56 and the fourth SiO2 layer 54 and by partially digging down the upper layer portion of the second BPSG layer 52. The second opening portion 42 is formed by penetrating through the cover layer 40 and by further digging down the second BPSG layer 52 partially, at the bottom portion of the first opening portion 38 over the fuse line portion 34.

Also, on the second BPSG layer 52, there are provided tungsten wirings 58.

With reference to FIG. 5, an explanation will be given on a method of manufacturing the conventional fuse element 30.

First, a fuse line portion 34 is formed on a grounding layer 32 such as an insulating layer formed on a semiconductor wafer. Then, on the fuse line portion 34, a first SiO2 layer 44 and a first BPSG layer 46 are sequentially formed. Thereafter, a first CMP (Chemical Mechanical Polishing) processing is performed on the first BPSG layer 46 to planarize the top surface thereof. Then, on the planarized first BPSG layer 46, a second SiO2 layer 48, a third SiO2 layer 50 and a second BPSG layer 52 are sequentially formed. Thereafter, a second CMP processing is performed on the second BPSG layer 52 to planarize the top surface thereof.

Next, tungsten wirings 58 are formed on the second BPSG film 52, by using well known photolithography process and etching process. With respect to memory (DRAM) cells, not shown in the drawing, fabricated on the semiconductor substrate on which the fuse element 30 is also fabricated, capacitors of the memory cells are formed after the above-mentioned planarization of the first BPSG layer 46.

Further, as interlayer insulating films or layers for forming a metal layer therebetween, a fourth SiO2 layer 54 and a fifth SiO2 layer 56 are sequentially formed on the second BPSG layer 52.

Then, by using photolithography process and etching process, first opening portion 38 is formed by penetrating through the fifth SiO2 layer 56 and the fourth SiO2 layer 54 and by partially digging down an upper layer portion of the second BPSG layer 52. It should be noted that formation of the first opening portion 38 is performed simultaneously with formation of through holes (not shown) on the predetermined portions of the tungsten wirings 58. Also, if necessary, other tungsten wirings (not shown) are formed on the fifth SiO2 layer 56, by using photolithography process and etching process, and are connected to the tungsten wirings 58 via the through holes mentioned above. Thereafter, a cover layer 40 is formed on the fifth SiO2 layer 56 as well as on inner walls of the first opening portion 38, and on the other tungsten wirings if they are formed.

Lastly, by using photolithography process, the second opening portion 42 is formed by etching through the cover layer 40 and by further etching down an upper portion of the second BPSG layer 52, at the bottom portion of the first opening portion 38 over the fuse line portion 34.

The above-mentioned conventional fuse element has the following disadvantages.

That is, when the above-mentioned fuse element is manufactured, CMP processing is performed on each of the first BPSG layer 46 and the second BPSG layer 52. Therefore, dispersion of film thickness of each of the BPSG films occurs every time CMP processing is performed. The thickness of the layers remaining on the fuse line portion 34 is controlled twice by controlling etching rate and etching time when forming the first opening portion 38 and the second opening portion 40.

As a result, the thickness of the layers remaining on the fuse line portion 34 disperses widely every memory chip or every semiconductor wafer. Therefore, it was impossible to obtain high P/W repair rate and to improve manufacturing yield of products.

More particularly, the inventor of this invention carefully studied the disadvantages of the conventional fuse element, and investigated the causes of dispersion of the thickness of the layers remaining on the fuse line portion and of deterioration of the P/W repair rate. As a result, it was found that, since CMP is performed twice to planarize the two BPSG layers, the thickness of each of the BPSG layers disperses every time CMP is performed and thereby dispersion of the thickness of the interlayer films on the fuse line portion becomes large, so that P/W repair rate deteriorates. Further, since the thickness of the layers left on the fuse line portion is controlled twice in the etching processes, that is, the etching process for forming the first opening portion and the etching process for forming the second opening portion, dispersion of the thickness of the layers left on the fuse line portion further becomes large. Due to these causes, uniformity of the thickness of the layers remaining on the fuse line portion is deteriorated.

Therefore, it becomes difficult to uniformly and stably melt down each fuse line portion when trimming is performed for replacing defective memory cells with normal cells, so that P/W repair rate is deteriorated.

In another way, in a manufacturing process of the conventional fuse element mentioned above, it is considered possible to omit the formation process of the first opening portion 38 and to form an opening by one time etching process until an upper portion of the second BPSG layer 52, after forming the cover layer 40. That is, by using photolithography process, the cover layer 40, the fifth SiO2 layer 56, the fourth SiO2 layer 54 and an upper portion of the second BPSG layer 52 are etched in one time. In this case, the thickness of the layers remaining on the fuse line portion is controlled in one time etching process. However, in such method, since the thickness of the layers to be removed by one time etching is too thick, it becomes difficult to precisely control the thickness of the layers remaining on the fuse line portion, instead of becoming easy. Further, the uniformity of the thickness of the layers remaining on each fuse line portion throughout the plane of a semiconductor substrate is also deteriorated.

SUMMARY OF THE INVENTION

It is therefore an object of the present invention to obviate the above-mentioned problems of the conventional fuse element and of the conventional method of manufacturing the fuse element.

It is another object of the present invention to provide a fuse element used in a memory device and a method of manufacturing such fuse element in which dispersion of the thickness of the layers remaining on a fuse line portion can be improved.

It is still another object of the present invention to provide a fuse element used in a memory device and a method of manufacturing such fuse element in which high and stable P/W rate can be attained to improve manufacturing yield of products.

According to an aspect of the present invention, there is provided a method of manufacturing a fuse element used in a memory device comprising: preparing a substrate on which a grounding layer is formed; forming a fuse line on the grounding layer formed on the substrate; forming a first interlayer insulating film including BPSG on the grounding layer so as to cover the fuse line; planarizing the top surface of the first interlayer insulating film; and forming a polycrystalline silicon (polysilicon) film on the first interlayer insulating film planarized. The method also comprises: forming a second interlayer insulating film including BPSG on the polysilicon film; planarizing the top surface of the second interlayer insulating film; partially etching the second interlayer insulating film and an upper region of the polysilicon film to form a first opening portion above the fuse line, wherein the polysilicon film is exposed within said first opening portion; forming a metal wiring layer on side and bottom walls of the first opening portion and on the second interlayer insulating film. The method further comprises: partially etching the metal wiring layer and the polysilicon film at the bottom portion of the first opening portion to form a second opening portion within the first opening portion and above the fuse line, wherein the first interlayer insulating film is exposed within the second opening portion; and forming an insulating film portion on at least inner walls of the first opening portion and the second opening portion; and partially etching at the bottom portion of the second opening portion the insulating film portion and an upper region of the first interlayer insulating film to form a third opening portion within the second opening portion and above the fuse line, wherein the first interlayer insulating film is exposed in the third opening portion.

In the method mentioned above, the insulating film portion may comprise at least one layer of interlayer insulating film and a cover insulating film.

In the method mentioned above, it is preferable that the planarizing the first interlayer insulating film is performed by reflow processing the first interlayer insulating film and then performing CMP processing on the first interlayer insulating film.

In the method mentioned above, when the first interlayer insulating film is reflow processed, the first interlayer insulating film may be heated in nitrogen atmosphere at a temperature between 780 degrees Celsius and 820 degrees Celsius.

In the method mentioned above, it is preferable that the planarizing the second interlayer insulating film is performed by reflow processing the second interlayer insulating film and then performing CMP processing on the second interlayer insulating film.

In the method mentioned above, when the second interlayer insulating film is reflow processed, the second interlayer insulating film may be heated in nitrogen atmosphere at a temperature between 780 degrees Celsius and 820 degrees Celsius.

In the method mentioned above, when the first opening portion is formed, it is possible to use the polysilicon layer as an etching stopper by utilizing a difference between the etching rate of said second interlayer insulating film and the etching rate of said polysilicon film.

In the method mentioned above, when the first opening portion is formed, it is preferable to use an etching process in which the etching rate of the polysilicon film is smaller than the etching rate of the second interlayer insulating film.

In the method mentioned above, when partially etching the metal wiring layer and the polysilicon film at the bottom portion of the first opening portion to form the second opening portion, it is preferable that the polysilicon film within the second opening portion is completely removed by controlling the quantity of over-etching of the polysilicon film.

In the method mentioned above, when forming the third opening portion, it is possible to adjust the thickness of the layers remaining on the fuse line by controlling etching condition of partially etching the insulating film portion and the upper region of the first interlayer insulating film at the bottom portion of the second opening portion.

In the method mentioned above, the memory device may be a dynamic random access memory (DRAM) device and so on.

According to another aspect of the present invention, there is also provided a fuse element which is produced by the above-mentioned method of manufacturing a fuse element.

For planarizing a BPSG layer or a layer including BPSG, any convenient method can be used. For example, it is possible to perform reflow processing on a BPSG layer formed and then to perform CMP processing, so that the BPSG layer is planarized. When the BPSG layer is to be reflow processed, the BPSG layer may be heated, for example, in nitrogen atmosphere at a temperature between 780 degrees Celsius and 820 degrees Celsius, for example.

In a process of forming a first opening portion in the method according to the present invention, the difference of etching rates between a second interlayer insulating film including BPSG and a polycrystalline silicon (polysilicon) layer is utilized, so that the polysilicon layer can function as a etching stopper layer. In a process of forming a second opening portion above a fuse line portion, when partially etching a wiring layer and a polysilicon layer at the bottom portion of the first opening portion, quantity of over etching in the etching is controlled such that the polysilicon layer is completely removed.

Also, in a process of forming a third opening portion, an insulating layer at the bottom portion of the second opening portion and an upper layer portion of the first interlayer film including BPSG are partially etched, and in this etching process the thickness of the layers remaining on the fuse line portion is controlled.

There is no limitation on the kind of a memory device to which the present invention is applied. An example of a memory device to which the present invention is applied is a DRAM (Dynamic Random Access Memory) device.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the attached drawings, preferred embodiments of the present invention will now be explained concretely and in detail.

FIGS. 1A through 1C, FIGS. 2A through 2C and FIGS. 3A and 3B are partial cross sectional views each showing a cross section of a substrate of a fuse element, in various stages of a process of manufacturing a fuse element according to an embodiment of the present invention.

A fuse element used in a memory device manufactured by this method is used for replacing defective memory cells with normal memory cells.

Figure 1A:
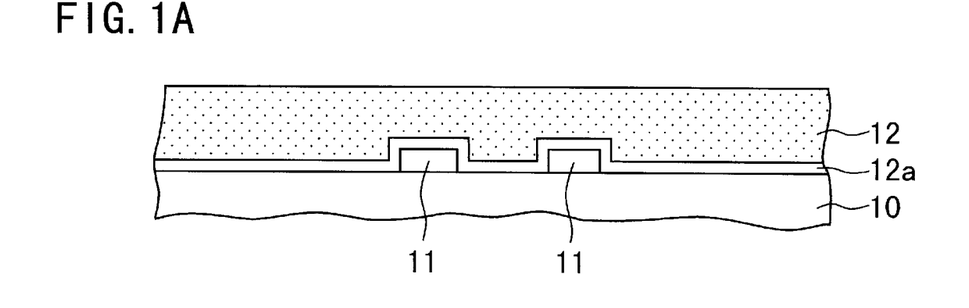
FIG. 1A through FIG. 1C are partial cross sectional views each showing a cross section of a substrate during a process of manufacturing a fuse element used in a memory device according to an embodiment of the present invention.

In order to fabricate a fuse element according to this method, a substrate, for example, a semiconductor substrate is prepared. A grounding layer 10 as shown in FIG. 1A which is, for example, an insulating layer is formed on the semiconductor substrate. Then, a layer of conductive material, such as a polycrystalline silicon (polysilicon) layer, is formed on the grounding layer 10. In this case, if necessary, it is possible to dope, for example, phosphorus into the polysilicon layer to lower resistance thereof. The polysilicon layer is then patterned into a fuse line portion 11, by using photolithography process and etching process. The fuse line portion 11 is formed on the grounding layer 10 and is also used as a bit line of the memory device. The fuse line potion 11 extends along the direction perpendicular to the sheet of the drawing.

Next, on the grounding layer 10 and on the fuse line portion 11, a BPSG film or layer 12 is formed by using, for example, CVD (Chemical Vapor Deposition) method. It is also possible to form, before forming the BPSG layer 12, an SiO2 film or layer 12a so as to cover the grounding layer 10 and the fuse line portion 11, and to form the BPSG layer 12 thereafter on the SiO2 film 12a. Then, the formed BPSG layer 12 is reflow processed in nitrogen atmosphere at approximately 800 degrees Celsius, that is, at a temperature, for example, between 780 degrees Celsius and 820 degrees Celsius. Thereafter, CMP processing is performed on the BPSG layer 12 and the surface of the BPSG layer 12 is planarized. Thereby, as shown in FIG. 1A, a first interlayer insulating film 12 comprising BPSG is formed on the grounding layer 10 such that the first interlayer insulating film 12 also covers the fuse line portion 11. When the SiO2 film 12a is formed before forming the BPSG film 12, the SiO2 film 12a can also be considered as a component of the first interlayer insulating film 12.

In the above-mentioned process, the BPSG film formed by using CVD process does not have a good uniformity of thickness throughout the surface of a wafer, that is, thickness of the BPSG film disperses. Also, by applying CMP process, dispersion of the thickness of the first interlayer insulating film becomes still larger.

Figure 1B:
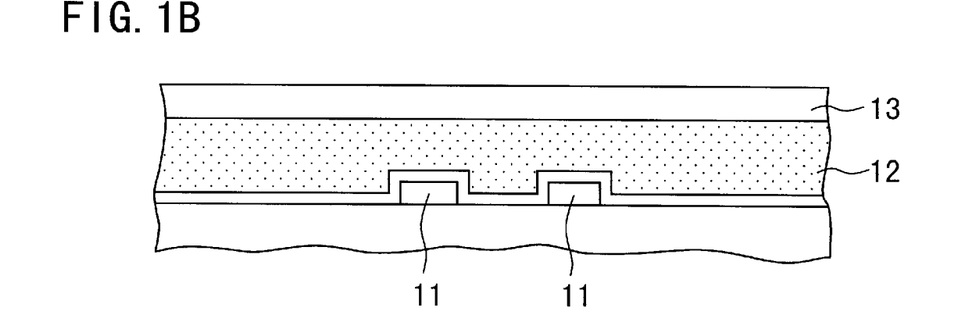

Then, a polysilicon film or layer 13 is formed on the first interlayer insulating film 12, and, if necessary, it is patterned by using photolithography process and etching process. Thereby, as shown in FIG. 1B, a polysilicon layer 13 which is also used as an etching stopper is formed. The patterned polysilicon layer 13 is also used as a polysilicon capacitor electrode of a memory cell.

Thereafter, another BPSG film or layer 14 is formed on the polysilicon layer 13 by using CVD process. The formed BPSG film 14 is then reflow processed in nitrogen atmosphere at approximately 800 degrees Celsius. Further, the top surface of the BPSG film 14 is CMP processed and flattened. Thereby, as shown in FIG. 1C, a second interlayer insulating film 14 comprising BPSG is formed on the polysilicon layer 13.

Figure 1C:
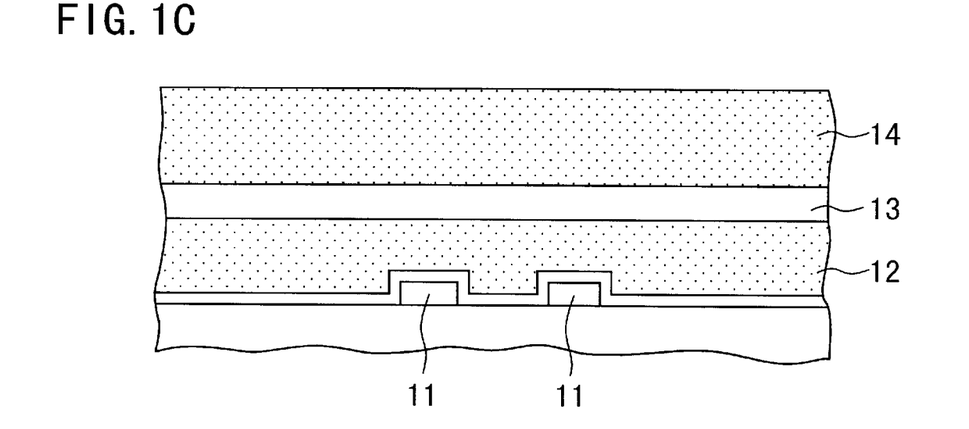

In the structure of FIG. 1C, the thickness of the second interlayer insulating film 14 disperses, similarly to the aforementioned first interlayer insulating film 12.

Figure 2A:
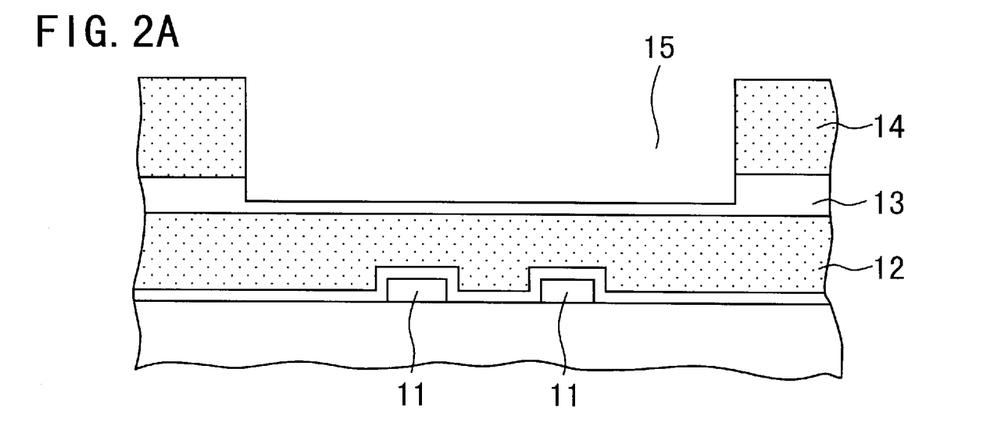
FIG. 2A through FIG. 2C are partial cross sectional views each showing a cross section of a substrate during a process of manufacturing a fuse element used in a memory device, which process is performed after the structure of FIG. 1C is obtained, according to an embodiment of the present invention.

Then, an etching mask is formed on the second interlayer insulating film 14 by using photolithography and the like, and the second interlayer insulating film 14 is etched to form a first opening portion 15 on the fuse line portion 11, as shown in FIG. 2A. Thereafter, the etching mask is removed when necessary.

In this embodiment, it is possible to make the polysilicon layer 13 function as etching stopper by utilizing the difference of etching rate between the BPSG film, constituting the second interlayer insulating film 14, and the polysilicon layer 13. By using an etching process in which the etching rate of the BPSG film is larger than that of the polysilicon film, it is possible to automatically and substantially stop etching when etching action reaches the polysilicon film 13.

Therefore, as shown in FIG. 2A, after the first opening portion 15 is formed, a part of the thickness, for example, approximately a half of the thickness, of the polysilicon layer 13 remains at the bottom of the first opening portion 15. Since the second interlayer insulating film 14 does not exist at the bottom portion of the opening portion 15, the above-mentioned dispersion of the thickness of the second interlayer insulating film 14 does not give bad influence on the final thickness and dispersion of the layers remaining on the fuse portion 11.

Figure 2B:
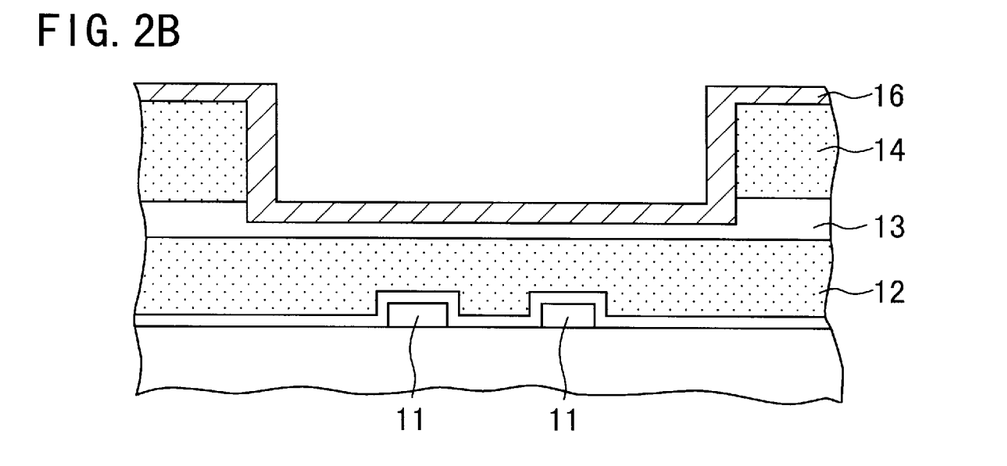

Next, as shown in FIG. 2B, a metal wiring film or layer 16 is formed on the second interlayer insulating film 14 and on the side and the bottom walls of the first opening portion 15.

Figure 2C:
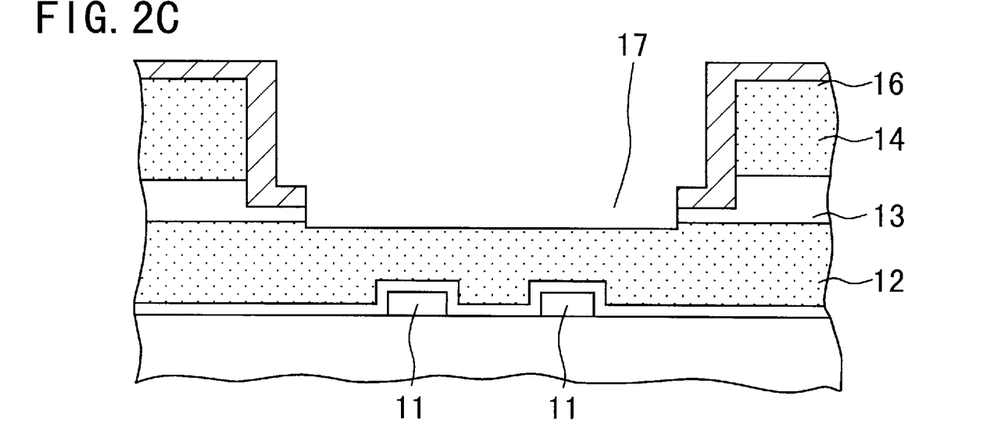

The metal wiring layer 16 and the polysilicon layer 13 are partially etched at the bottom portion of the first opening portion 15 by using, for example, photolithography process. Thereby, as shown in FIG. 2C, a second opening portion 17 is formed within the first opening portion 15 and on the fuse line portion 11. In the second opening portion 17, the metal wiring layer 16 is completely removed from an area over the fuse line portion 11, so that the metal wiring portion 16 does not exist above the fuse line portion 11. The metal wiring layer 16 exists surrounding the fuse line portion 11. When the etching for forming the second opening portion 17 is performed, quantity of over etching the polysilicon film 13 is controlled such that the polysilicon film 13 within the second opening 17 is completely removed and the first interlayer insulating film 12 is exposed.

Figure 3A:
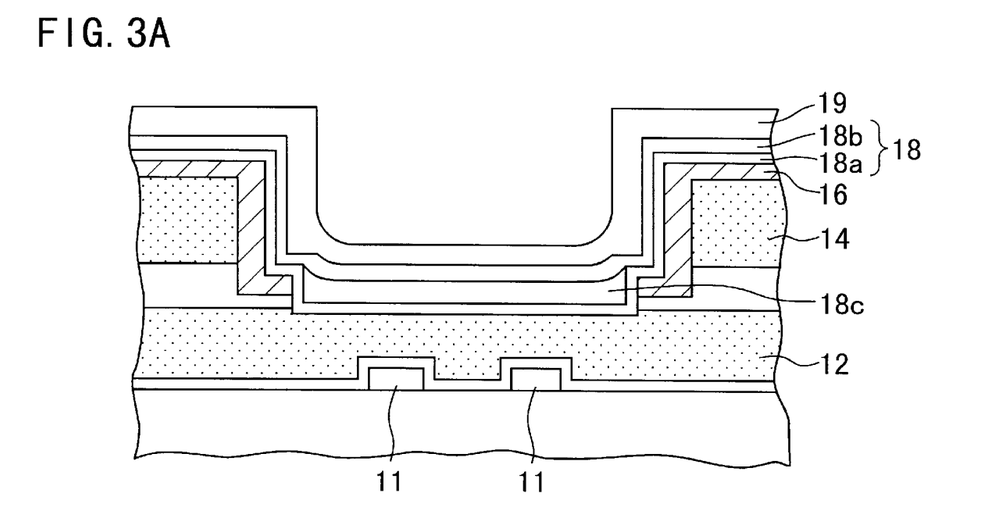
FIG. 3A through FIG. 3B are partial cross sectional views each showing a cross section of a substrate during a process of manufacturing a fuse element used in a memory device, which process performed after the structure of FIG. 2C is obtained, according to an embodiment of the present invention.

Then, as shown in FIG. 3A, an interlayer insulating film or layer 18, which is usable for forming a metal layer thereon, and a cover insulating film or layer 19 are sequentially formed on the metal wiring layer 16 including a portion within the first opening portion 15 and on the side and bottom walls of the second opening portion 17. It is possible to form the interlayer insulating film 18 by a plurality of insulating films, for example, a first plasma oxide film 18a and a second plasma oxide film 18b. In such case, after forming the first plasma oxide film 18a, it is also possible to apply a silica film on the first plasma oxide film 18a. Then, the silica film is etched back such that the silica film portion 18c remains only on the side and bottom walls or at least on the bottom wall of the second opening portion 17, as shown in FIG. 3A. Thereafter, the second plasma oxide film 18b may be formed on the remained silica film portion 18c and on the first plasma oxide film 18a.

If necessary, it is also possible to form a layer of other metal wirings (not shown in the drawing) on the interlayer insulating film 18 by using photolithography and etching process, after forming the interlayer insulating film 18 and before forming the cover insulating film 19. In this case, before forming the layer of other metal wirings not shown in the drawing, it is also possible to form through holes at predetermined locations of the interlayer insulating film 18 and to electrically couple the metal wirings 16 and the metal wirings of the layer of other metal wirings not shown in the drawing, via the through holes.

Figure 3B:
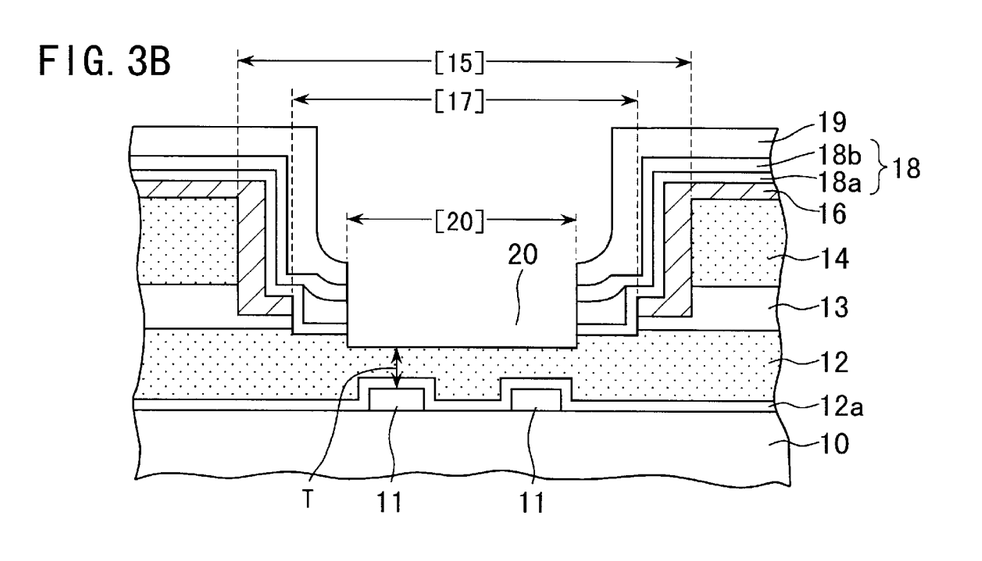
Figure 4:
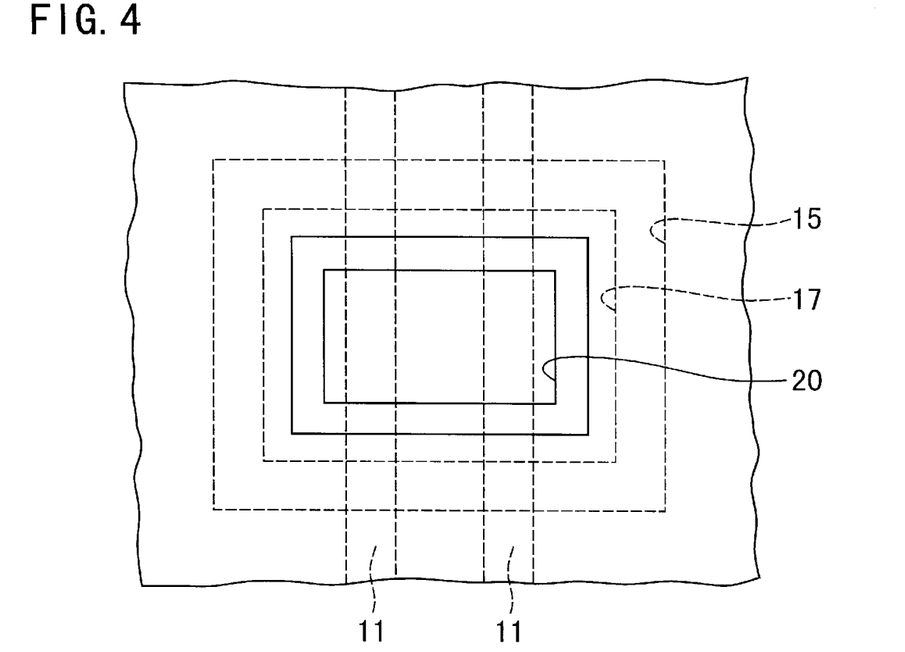
FIG. 4 is a partial plan view of the structure of FIG. 3B.

Then, the cover insulating films 19 and the interlayer insulating film 18 at the bottom portion of the second opening portion 17 are partially etched off by using, for example, photolithography. Thereby, as shown in FIG. 3B and as shown in FIG. 4 which is a plan view corresponding to FIG. 3B, a third opening portion 20 is opened within the second opening portion 17 and at an area above the fuse line portion 11. When the third opening portion 20 is formed, etching condition, such as etching time, and the like, is controlled such that the thickness T of the first interlayer insulating film 12 remaining on the fuse line portion 11 becomes a predetermined value. Since the thickness T of the first interlayer insulating film 12 remaining on the fuse line portion 11 is controlled in one time etching process, dispersion of the thickness T of the first interlayer insulating film 12 remaining on the fuse line portion 11 can be considerably smaller than that of the conventional fuse element.

In the fuse element mentioned above, on the fuse line portion 11 used for replacing defective memory cells with normal cells, the polysilicon film 13 as an etching stopper is formed, and the second interlayer insulating film 14 above the fuse line portion 11 is removed by the etching performed when the first opening portion 15 is opened. Therefore, the thickness T of the layers remaining above the fuse line portion 11 can be controlled by one time etching process when the cover insulating film 19 and so on are etched to form the third opening portion 20.

Therefore, dispersion of the thickness of the layers remaining on the fuse line portion 11 depends on the dispersion of the thickness of the first interlayer insulating film 12, but does not depend on the dispersion of the thickness of the second interlayer insulating film 14. Thus, when compared with the conventional fuse element, dispersion of the thickness T of the layers remaining on the fuse portion 11 can be suppressed drastically in the present invention.

As a result, when fuse trimming is performed, for example, in a memory device to replace defective memory cells, dispersion of power level of laser beam arriving at each fuse line portion 11 can be suppressed, and the fuse trimming can be appropriately and reliably performed, so that deterioration of P/W repair rate can also be avoided.

Also, in the above-mentioned example, when through holes are formed through the interlayer insulating film 18, opening portions above the fuse line portions are not formed simultaneously. Since the process for forming the through holes in the interlayer insulating film 18 does not affect the thickness of the layers remaining on the fuse line portion 11, it is not necessary to precisely control the quantity of etching when the through holes are formed in the interlayer insulating film 18.

Further, according to the present invention, since the process for forming the through holes in the interlayer insulating film 18 does not give influence on the thickness of the layers on the fuse line portion 11, it is possible to etch over the thickness of the interlayer insulating film 18. Therefore, for example, even in a semiconductor device in which through holes must be formed above the first opening portion 15, for example, in a peripheral circuit area and the like, it is possible to avoid defective or incomplete conduction of the through holes.

In the above description, the CMP processing is performed after the first interlayer insulating film 12 is formed and after the second interlayer insulating film 14 is formed. However, application of the present invention is not limited only to semiconductor devices using CMP processing. The present invention is also applicable to semiconductor devices and so on in which CMP processing is not used but wet etching back process or reflow process in nitrogen atmosphere is used. Even in such case, advantageous effects of the present invention can be similarly obtained.

Consequently, according to the present invention, above a fuse line portion used for replacing defective memory cells with normal memory cells, a polysilicon film as an etching stopper is formed, and a second interlayer insulating film above the fuse line portion is removed by the etching performed when a first opening portion is opened. Therefore, the thickness of layers remaining on the fuse line portion can be controlled by one time etching process when a cover insulating film and so on are etched to form a third opening portion.

Therefore, dispersion of the thickness of the layers remaining on the fuse line portion depends on the dispersion of the thickness of the first interlayer insulating film including BPSG, but does not depend on the dispersion of the thickness of the second interlayer insulating film including BPSG. Thus, when compared with the prior art technique in which dispersion of the thickness of the layers remaining on the fuse line portion is affected by dispersion of thickness of a first BPSG film and dispersion of thickness of a second BPSG film and in which the thickness of the layers remaining on the fuse line portion is controlled in etching processes in twice, dispersion of the thickness of the layers remaining on the fuse line portion can be suppressed drastically.

Therefore, by using fuse elements manufactured in accordance with the method of the present invention, when fuse trimming is performed, for example, in a memory device to replace defective memory cells, dispersion of power level of laser beam arriving at each fuse line portion can be reduced, and the fuse trimming can be appropriately and reliably performed, so that deterioration of P/W repair rate can also be avoided.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a fuse element used in a memory device comprising:
   preparing a substrate on which a grounding layer is formed;
   forming a fuse line on said grounding layer formed on said substrate;
   forming a first interlayer insulating film including BPSG on said grounding layer so as to cover said fuse line;
   planarizing the top surface of said first interlayer insulating film;
   forming a polycrystalline silicon (polysilicon) film on said first interlayer insulating film planarized;
   forming a second interlayer insulating film including BPSG on said polysilicon film;
   planarizing the top surface of said second interlayer insulating film;
   partially etching said second interlayer insulating film and an upper region of said polysilicon film to form a first opening portion above said fuse line, wherein said polysilicon film is exposed within said first opening portion;
   forming a metal wiring layer on side and bottom walls of said first opening portion and on said second interlayer insulating film;
   partially etching said metal wiring layer and said polysilicon film at the bottom portion of said first opening portion to form a second opening portion within said first opening portion and above said fuse line, wherein said first interlayer insulating film is exposed within said second opening portion;
   forming an insulating film portion on at least inner walls of said first opening portion and said second opening portion; and
   partially etching at the bottom portion of said second opening portion said insulating film portion and an upper region of said first interlayer insulating film to form a third opening portion within said second opening portion and above said fuse line, wherein said first interlayer insulating film is exposed in said third opening portion.

2. A method of manufacturing a fuse element used in a memory device as set forth in claim 1, wherein said insulating film portion comprises at least one layer of interlayer insulating film and a cover insulating film.

3. A method of manufacturing a fuse element used in a memory device as set forth in claim 1, wherein said planarizing the top surface of said first interlayer insulating film is performed by reflow processing said first interlayer insulating film and then performing CMP processing on said first interlayer insulating film.

4. A method of manufacturing a fuse element used in a memory device as set forth in claim 3, wherein when said first interlayer insulating film is reflow processed, said first interlayer insulating film is heated in nitrogen atmosphere at a temperature between 780 degrees Celsius and 820 degrees Celsius.

5. A method of manufacturing a fuse element used in a memory device as set forth in claim 1, wherein said planarizing the top surface of said second interlayer insulating film is performed by reflow processing said second interlayer insulating film and then performing CMP processing on said second interlayer insulating film.

6. A method of manufacturing a fuse element used in a memory device as set forth in claim 5, wherein when said second interlayer insulating film is reflow processed, said second interlayer insulating film is heated in nitrogen atmosphere at a temperature between 780 degrees Celsius and 820 degrees Celsius.

7. A method of manufacturing a fuse element used in a memory device as set forth in claim 1, wherein when said first opening portion is formed, said polysilicon layer functions as an etching stopper by utilizing a difference between the etching rate of said second interlayer insulating film and the etching rate of said polysilicon film.

8. A method of manufacturing a fuse element used in a memory device as set forth in claim 1, wherein when said first opening portion is formed, an etching process is used in which the etching rate of said polysilicon film is smaller than the etching rate of said second interlayer insulating film.

9. A method of manufacturing a fuse element used in a memory device as set forth in claim 1, wherein when partially etching said metal wiring layer and said polysilicon film at the bottom portion of said first opening portion to form said second opening portion, said polysilicon film within said second opening portion is completely removed by controlling the quantity of overetching of said polysilicon film.

10. A method of manufacturing a fuse element used in a memory device as set forth in claim 1, wherein, when forming said third opening portion, the thickness of the layers remaining on said fuse line is adjusted by controlling etching condition of partially etching the insulating film portion and the upper region of said first interlayer insulating film at the bottom portion of said second opening portion.

11. A method of manufacturing a fuse element used in a memory device as set forth in claim 1, wherein said memory device is a dynamic random acces memory (DRAM) device.

* * * * *